(12) United States Patent
Kato et al.

(10) Patent No.: US 10,005,362 B2
(45) Date of Patent: Jun. 26, 2018

(54) ELECTRIC VEHICLE CONTROL DEVICE

(71) Applicants: Central Japan Railway Company, Nagoya-shi (JP); Toshiba Infrastructure Systems & Solutions Corporation, Kawasaki-shi (JP)

(72) Inventors: Hirokazu Kato, Funabashi (JP); Hiroki Shimoyama, Nagoya (JP); Kei Sakanoue, Kiyose (JP); Toshiyuki Uchida, Kiyose (JP); Tomoyuki Makino, Iruma (JP); Hiroaki Otani, Fuchu (JP); Manato Mori, Suginami (JP)

(73) Assignees: Central Japan Railway Company, Nagoya-shi (JP); TOSHIBA INFRASTRUCTURE SYSTEMS & SOLUTIONS CORPORATION, Kawasaki-shi (JP)

( * ) Notice: Subject to any disclaimer, the term of this patent is extended or adjusted under 35 U.S.C. 154(b) by 115 days.

(21) Appl. No.: 15/108,201

(22) PCT Filed: Dec. 15, 2014

(86) PCT No.: PCT/JP2014/083172
§ 371 (c)(1),
(2) Date: Jun. 24, 2016

(87) PCT Pub. No.: WO2015/098600
PCT Pub. Date: Jul. 2, 2015

(65) Prior Publication Data
US 2016/0339783 A1    Nov. 24, 2016

(30) Foreign Application Priority Data
Dec. 26, 2013   (JP) .................. 2013-270100

(51) Int. Cl.
| | | |
|---|---|---|
| *B60L 3/00* | (2006.01) | |
| *B60L 9/28* | (2006.01) | |
| *B62D 65/00* | (2006.01) | |
| *G01R 31/00* | (2006.01) | |

(52) U.S. Cl.
CPC ............... *B60L 3/0061* (2013.01); *B60L 9/28* (2013.01); *B62D 65/005* (2013.01);
(Continued)

(58) Field of Classification Search
USPC .............. 701/22, 48, 31.8, 32.8; 318/139
See application file for complete search history.

(56) References Cited

U.S. PATENT DOCUMENTS

| 7,994,798 B2 * | 8/2011 | Williams ........... G01R 31/2829 318/139 |
| 2003/0033060 A1 * | 2/2003 | Okoshi ................. B60K 6/365 701/22 |

(Continued)

FOREIGN PATENT DOCUMENTS

| JP | 9-182498 A | 7/1997 |
| JP | 2010-213557 A | 9/2010 |

(Continued)

OTHER PUBLICATIONS

International Search Report dated Mar. 24, 2015 in PCT/JP14/083172 Filed Dec. 15, 2014.

*Primary Examiner* — Bao Long T Nguyen
(74) *Attorney, Agent, or Firm* — Oblon, McClelland, Maier & Neustadt, L.L.P.

(57) ABSTRACT

An electric vehicle control device includes: a plurality of motors capable of transmitting motive power to a wheel of an electric vehicle; an inverter that supplies electric power to drive the motors; and a controller that controls the inverter and compares, when the electric vehicle drives under a certain velocity condition, a q-axis voltage feedforward (Continued)

value VqFF and a q-axis voltage command value Vq* used for controlling driving of the motors, to detect an occurrence of miswire between the motors and the inverter when the following inequation is satisfied: $VqFF \geq 1.5 \cdot Vq^*$.

8 Claims, 3 Drawing Sheets

(52) U.S. Cl.
CPC ........ *G01R 31/007* (2013.01); *B60L 2200/26* (2013.01); *B60L 2210/30* (2013.01); *B60L 2210/40* (2013.01); *B60L 2240/12* (2013.01); *B60L 2240/32* (2013.01); *B60L 2240/421* (2013.01); *B60L 2240/427* (2013.01); *B60L 2240/429* (2013.01); *B60L 2240/527* (2013.01); *B60L 2240/529* (2013.01); *B60L 2250/16* (2013.01); *B60L 2270/40* (2013.01); *Y02T 10/648* (2013.01); *Y02T 10/7241* (2013.01)

(56) References Cited

U.S. PATENT DOCUMENTS

| | | | |
|---|---|---|---|
| 2010/0194322 A1* | 8/2010 | Negoro | B60L 3/003 318/454 |
| 2012/0146683 A1* | 6/2012 | Tanimoto | B60L 3/0061 324/765.01 |
| 2013/0134917 A1 | 5/2013 | Kaneko | |
| 2014/0246999 A1* | 9/2014 | Kezobo | B62D 5/0484 318/400.23 |
| 2014/0354292 A1* | 12/2014 | Hiti | G01R 31/007 324/503 |

FOREIGN PATENT DOCUMENTS

| | | |
|---|---|---|
| JP | 2011-88337 A | 5/2011 |
| JP | 2012-223020 A | 11/2012 |
| JP | 2013-113695 A | 6/2013 |
| JP | 2014-23282 A | 2/2014 |

* cited by examiner

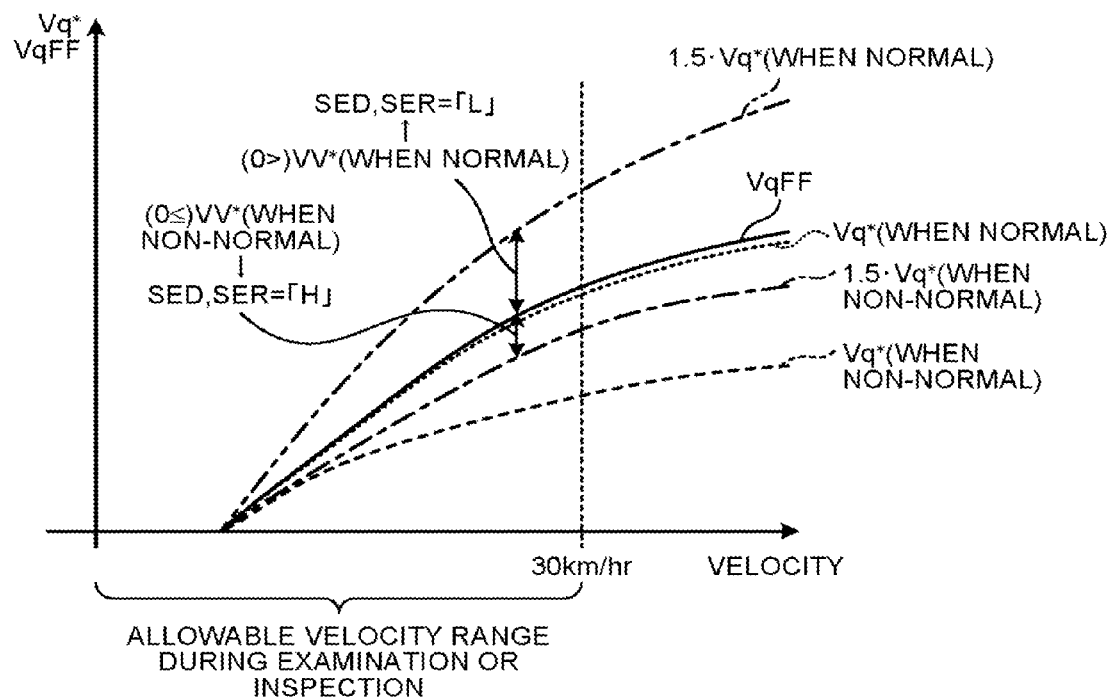

ELECTRIC VEHICLE CONTROL DEVICE

CROSS-REFERENCE TO RELATED APPLICATIONS

This application is national stage application of International Application No. PCT/JP2014/083172, filed Dec. 15, 2014, which designates the United States, incorporated herein by reference, and which claims the benefit of priority from Japanese Patent Application No. 2013-270100, filed Dec. 26, 2013, the entire contents of each of which are incorporated herein by reference.

FIELD

Embodiments described herein relate generally to an electric vehicle control device.

BACKGROUND

In general, motors (electric motors) mounted on electric vehicles and inverters driving the motors are manufactured in different places manufacturers), and wiring workers who connect motors and inverters on electric vehicles are mostly different from their manufacturers. Because of this, motors and inverters may be electrically wired (connected) erroneously.

Such a problem may occur not only during the manufacture of electric vehicles but also during inspection or replacement work for the motors or inverters.

Further, the miswire causes the motors to reversely rotate. Conventionally, such miswire between the motors and the inverters is detected by detecting currents generated by the reverse rotations of the motors.

SUMMARY OF THE INVENTION

Problem to be Solved by the Invention

However, in an electric vehicle on which a number of motors are mounted, if a majority of the motors are correctly wired and normally rotate, the wheels of the electric vehicle are all rotated in the same direction. Accordingly, erroneously wired motors are prevented from reversely rotating and moved along with the motion of the wheels. They do not reversely rotate against the rotation of the correctly wired motors.

Thus, the miswire cannot be detected by the conventional method as above, which may lead to an excessive amount of currents flowing into the erroneously wired motors due to the miswire and damaging the motors.

In view of the above problem, the present invention aims to provide an electric vehicle control device which can accurately detect a miswire between motors and an inverter in an electric vehicle incorporating a plurality of motors.

BRIEF DESCRIPTION OF DRAWINGS

FIG. 3 is an exemplary illustrative diagram for the operation in the embodiment.

DETAILED DESCRIPTION

According to an embodiment, an electric vehicle control device comprises a plurality of motors capable of transmitting motive power to a wheel of an electric vehicle; an inverter that supplies electric power to drive the motors; and a controller that controls the inverter and compares, when the electric vehicle drives under a certain velocity condition, a q-axis voltage feedforward value VqFF and a q-axis voltage command value Vq* used for controlling driving of the motors, to detect an occurrence of miswire between the motors and the inverter when the following inequation is satisfied: VqFF≥1.5·Vq*.

Now, an embodiment will be described with reference to the accompanying drawings.

Figure 1:
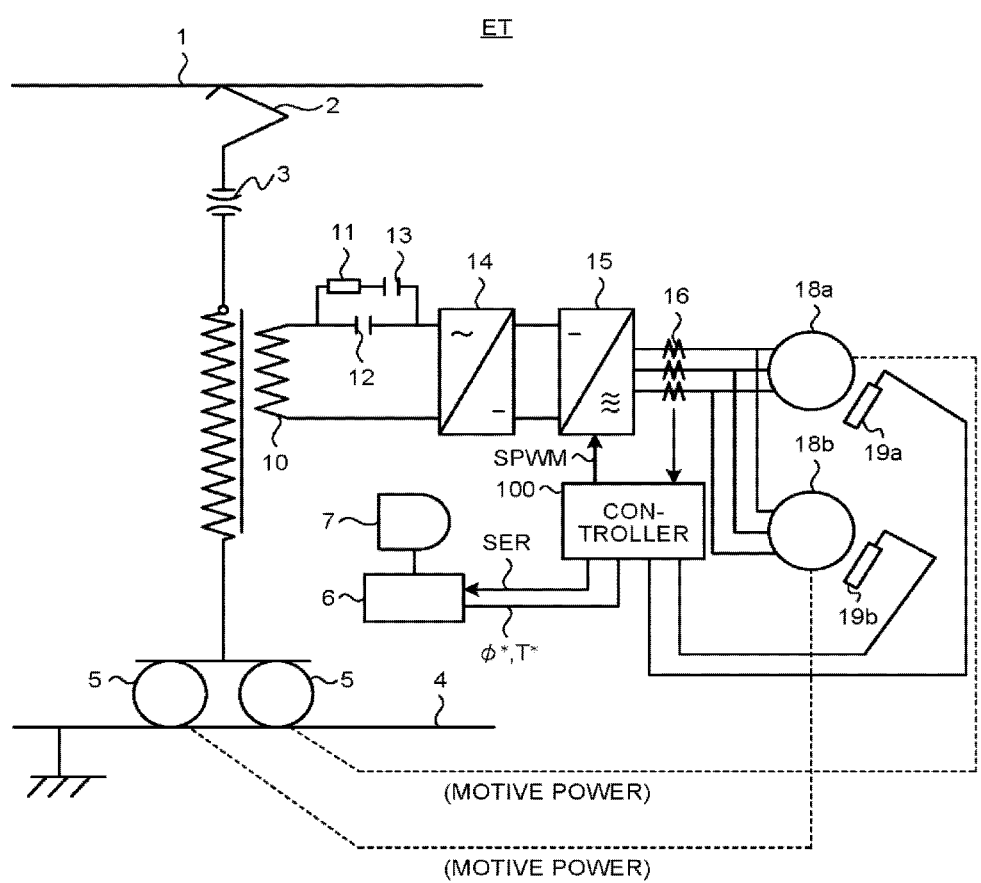
FIG. 1 is an exemplary schematic configuration diagram of an electric vehicle system including an electric vehicle control device according to an embodiment.

FIG. 1 is a schematic configuration diagram of an electric vehicle system including an electric vehicle control device according to one embodiment.

An electric vehicle system ET, as shown in FIG. 1, includes an overhead wire 1 that supplies alternating-current power, a pantograph 2 for receiving the supply of the alternating-current power from the overhead wire 1, a master breaker 3 that interrupts the alternating-current power supplied from the overhead wire 1 via the pantograph 2, wheels 5 of an electric vehicle grounded via a rail 4, an operation board 6 including a master controller, with which a driver conducts various kinds of operation, and a display board 7 that displays various kinds of information such as vehicle velocity.

The electric vehicle system ET further includes a transformer 10 that transforms a voltage of the alternating-current power supplied from the overhead wire 1, a current-limiting resistor 11 for limiting an inrush current, a contactor 12 that supplies the power from the transformer 10 to a following stage, and a current-limiting resistance contactor 13 for forming a closed circuit including the current-limiting resistor 11 prior to a closed state (ON state) of the contactor 12 for the purpose of limiting the inrush current at the time of closing the contactor 12.

The electric vehicle system ET further includes a converter 14 that converts the alternating-current power supplied via the contactor 12 into direct-current power with a certain voltage, an inverter (variable voltage, variable frequency inverter) 15 that converts the direct-current power output from the converter 14 to three-phase alternating-current power with a desired frequency and voltage, and a current sensor unit 16 including current sensors which detect the U-phase, V-phase, and W-phase currents of the three-phase alternating-current power output from the inverter 15, respectively.

The electric vehicle system ET further includes a plurality of motors 18a, 18b driven by the inverter 15 to transmit motive power to the corresponding wheels 5, velocity sensors 19a, 19b that detect the velocities of the motors 18a, 18b, respectively, and a controller 100 that controls the driving of the motors 18a, 18b.

Figure 2:
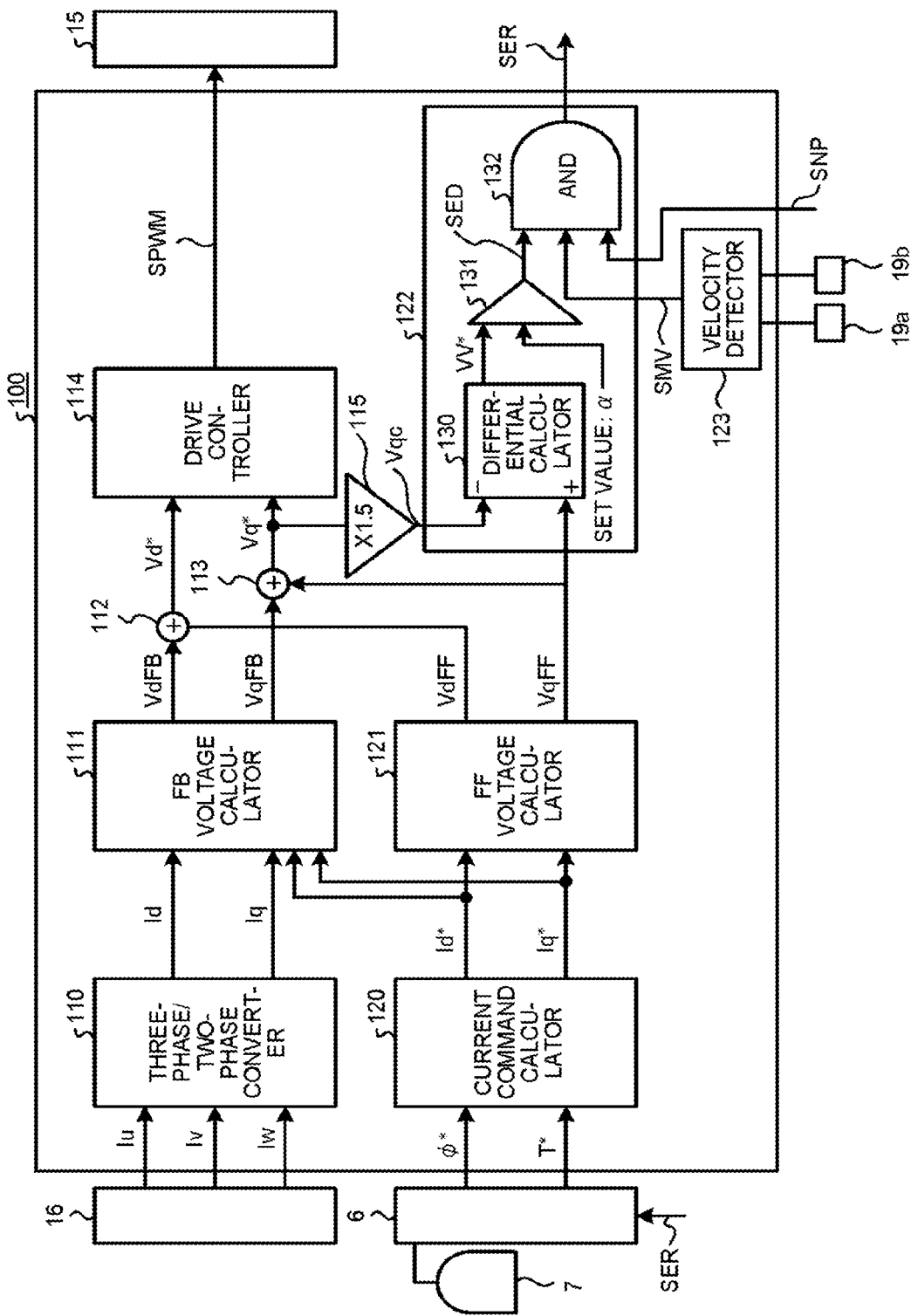
FIG. 2 is an exemplary schematic configuration block diagram of a controller according to the embodiment.

FIG. 2 is a schematic configuration block diagram of the controller. The controller 100 includes a three-phase/two-phase converter 110 which receives a U-phase current signal Iu, a V-phase current signal Iv, and a W-phase current signal 1w from the current sensor unit 16 for three-phase to two-phase conversion to obtain a d-axis current Id and a q-axis current Iq, and a current command calculator 120 which receives a magnetic flux command Φ* and a torque command T* to calculate a d-axis current command Id* and a q-axis current command Iq* for output.

The controller 100 further includes a feedback (FL) voltage calculator 111 which receives the d-axis current Id, the q-axis current Iq, the d-axis current command Id*, and the q-axis current command Iq* to calculate a d-axis feedback voltage VdFB and a q-axis feedback voltage VqFB for output, and a feedforward (FF) voltage calculator 121 which receives the d-axis current command Id* and the q-axis current command Iq* to calculate a d-axis feedforward voltage VdFF and a q-axis feedforward voltage VqFF for output.

The controller 100 further includes a first adder 112 which adds the d-axis feedforward voltage VdFF to the d-axis feedback voltage VdFB to output a d-axis voltage command Vd*, a second adder 113 which adds the q-axis feedforward voltage VqFF to the q-axis feedback voltage VqFB to output a q-axis voltage command Vq*, and a drive controller 114 which generates a PWM control signal SPWM according to the d-axis voltage command Vd* and the q-axis voltage command Vq* for output to the inverter 15.

The controller 100 further includes an amplifier 115 which amplifies the q-axis voltage command Vq* by 1.5 times for output as a comparative voltage Vqc (=1.5·Vq*), a miswire detector 122 which detects a miswire according to the comparative voltage Vqc and the q-axis feedforward voltage VqFF to output a miswire detection output signal SER, and a vehicle velocity detector 123 which detects the velocity of the electric vehicle according to the outputs of the velocity sensors 19a, 19b.

The configuration of the miswire detector 122 is now described.

The miswire detector 122 includes a differential calculator 130 which calculates a difference between the comparative voltage Vqc and the q-axis feedforward voltage VqFF to output a differential voltage VV*(=VqFF−Vqc).

The miswire detector 122 further includes a comparator 131 which determines whether or not the differential voltage VV* is equal to or above 0, and turns a miswire detection signal SED to "H"-(High) level upon determining that the differential voltage is 0 or more, that is, VqFF≥Vqc.

The miswire detector 122 further includes an AND circuit 132 that receives a notch position signal SNP which turns to "H"-level when a notch position of the master controller is at or below a 3-notch (maximal notch position during examination or inspection), receives a motion detection signal SMV which turns to "H"-level when the electric vehicle drives at a velocity of 30 km/hr (maximal allowable velocity during examination or inspection) or less, and receives the miswire detection signal, to obtain a logical AND of these signals and output a miswire detection output signal SER.

Next, the operation in the embodiment will be described.

In the following both of the motors 18a, 18b are assumed to be connected to the inverter 15 via wiring.

In such a connection, an operator places the master breaker 3 in an open state (OFF state) and activates the pantograph 2 with a not-shown activator to contact the overhead wire 1.

Then, the operator places the current-limiting resistance contactor 13 in a closed state (ON state) to form the current-limiting resistor 11 as a closed circuit including the transformer 10 and the converter 14.

As a result, the difference in voltage (voltage difference equivalent to a voltage drop in the current-limiting resistor 11) between both ends of the master breaker 3 is reduced to small, thus, with the occurrence of inrush currents inhibited, the operator can place the master breaker 3 in the closed state.

In response to the closed state of the master breaker 3, the transformer 10 transforms the voltage of the alternating-current power supplied from the overhead wire 1 and supplies the voltage to the converter 14.

The converter 14 is supplied with the alternating-current power from the overhead wire 1 at the transformed voltage by the transformer 10 to convert the supplied alternating-current power to direct-current power with a certain voltage for output to the inverter 1

The inverter 15 converts the direct-current power output from the converter 14 to three-phase (U-phase, V-phase, W-phase) alternating-current power with a desired frequency and voltage according to a later-described PWM control signal SP input from the drive controller 114, and supplies the alternating-current power to the motors 18a, 18b.

In parallel thereto, the current sensor unit detects a U-phase current, a V-phase current, and a W-phase current to output a U-phase current signal Iu, a V-phase current signal Iv, and a W-phase current signal Iw to the three-phase/two-phase converter 110 of the controller 100.

The vehicle velocity detector 123 detects the velocity of the electric vehicle according to the outputs of the velocity sensors 19a, 19b and outputs, to the AND circuit 132, the motion detection signal SMV which turns "N"-level when the electric vehicle drives at the velocity of 30 km/hr (=a preset value as a maximal allowable velocity during examination or inspection) or less.

Also input to the AND circuit 132 is the notch position signal SNP which turns to "H"-level when the notch position of the master controller on a control platform is at 3-notch (=a preset value as a maximal notch position during examination or inspection) or less.

The three-phase/two-phase converter 110 of the controller 100 receives the U-phase current signal Iu, the V-phase current signal Iv, and the W-phase current signal Iw from the current sensor unit 16 for three phase/two phase conversion to obtain the d-axis current Id and the q-axis current Iq for output to the feedback voltage calculator 111.

In parallel thereto, the current command calculator 120 receives the magnetic flux command Φ* and the torque command T* and calculates the d-axis current command Id* and the q-axis current command Iq* for output to the feedback voltage calculator 111 and the feedforward (FF) voltage calculator 121.

Thereby, the feedback voltage calculator 111 calculates the d-axis feedback voltage VdFB and the q-axis feedback voltage VqFB according to the input d-axis current Id, q-axis current Iq, d-axis current command Id*, and q-axis current command Iq* to output the voltages to the drive controller 114.

The feedforward (FE) voltage calculator 121 calculates the d-axis feedforward voltage VdFF and the q-axis feedforward voltage VqFF according to the input d-axis current command Id* and q-axis current command Iq* to output the d-axis feedforward voltage VdFF to the first adder 112 and output the q-axis feedforward voltage VqFF to the second adder 113 and the differential calculator 130 of the miswire detector 122.

The first adder 112 adds the d-axis feedforward voltage VdFF to the d-axis feedback voltage VdFB to output the d-axis voltage command Vd* to the drive controller 114. The second adder 113 adds the q-axis feedforward voltage VqFF to the q-axis feedback voltage VqFB to output the q-axis voltage command Vq* to the drive controller 114 and the amplifier 115.

The drive controller 114 generates the PWM control signal SPWM according to the d-axis voltage command Vd* and the q-axis voltage command Vq* for output to the inverter 15.

The amplifier 115 amplifies the input q-axis voltage command Vq* by 1.5 times and outputs it as a comparative voltage Vqc (=1.5·Vq*) to the differential calculator 130 of the miswire detector 122, Herein, the amplification rate of the amplifier 115 is set to 1.5 times because it was confirmed by test results that relative to the d-axis voltage command Vd* which can take various different values when actually input, the values during normalcy and the values during anomaly can be accurately distinguished. That is, it was confirmed that at VqFF≥1.5·Vq*, anomaly can be accurately determined while at VqFF<1.5·Vq*, normalcy can be accurately determined.

The differential calculator 130 of the wire detector 122 calculates a difference between the comparative voltage Vqc and the q-axis feedforward voltage VqFF to output a differential voltage VV*(=VqFF−Vqc) to the comparator 131.

FIG. 3 is an illustrative diagram for the operation according to the embodiment.

Hence, the comparator 131 determines whether or not the differential voltage VV* is equal to or exceeds a set value α(=0), and outputs the miswire detection signal SED at "H"-level to the AND circuit 132 when determining that the differential voltage VV* is 0 or more, that is, $$VqFF \geq Vqc (=1.5 \cdot Vq^*).$$

The AND circuit 132 receives the miswire detection signal SED, the notch position signal SNP, and the motion detection signal SMV and obtains a logical AND of the signals to output the miswire detection output signal SER.

Thus, the AND circuit 132 outputs the miswire detection output signal SER at the "H"-level when the differential voltage VV* is 0 or more, that is, VqFF≥Vqc, the velocity of the electric vehicle is 30 km/hr (=a preset value as a maximal allowable velocity during examination or inspection) or less, and the notch position of the master controller on the control platform is at 3-notch or less (=a preset value as a maximal notch position during examination or inspection).

Accordingly, when VqFF≥Vqc is satisfied during examination or inspection (at the velocity of 30 km/hr or less and the notch position at 3-notch or less), the miswire detector 122 determines presence of a miswire and outputs the miswire detection output signal SER at "H"-level.

Meanwhile, the comparator 131 outputs the miswire detection signal SED at "L" (Low)-level to the AND circuit 132 when the differential voltage VV* is less than 0, that is, $$VqFF < Vqc (=1.5 \cdot Vq^*)$$

The AND circuit 132 receives the miswire detection signal SED, the notch position signal SNP, and the motion detection signal SMV to obtain a logical AND of these signals and output the miswire detection output signal SER at "L"-level. Normal wiring between the motors 18a, 18b and the inverter 15 is thus found.

This accordingly makes it possible to accurately and easily detect the miswire between the motors 18a, 18b and the inverter 15.

In this case, the miswire detection output signal SER is output to other controllers, the display board 7 provided in a driver's cab, an operation device with a display carried by a driver or an examination or inspection worker (operator), or the operation board 6 to be able to notify the driver or the examination or inspection worker (operator).

Accordingly, the driver or worker can easily recognize the occurrence of miswire.

In the above description, although only the single circuit is provided, which includes the current-limiting resistor 11, the contactor 12, the current-limiting resistance contactor 13, the converter 14, the inverter 15, the current sensor unit 16, the motors 18a, 18b, and the controller 100, a plurality of circuits can be also provided in the transformer 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from e spirit of the inventions. The accompanying claims and their equivalents are intended to cover such forms or modifications as would fall within the scope and spirit of the inventions.

The invention claimed is:

1. An electric vehicle control device comprising:
   a plurality of motors capable of transmitting motive power to a wheel of an electric vehicle;
   an inverter that supplies electric power to drive the plurality of motors; and
   a controller that controls the inverter and compares, when the electric vehicle drives under a certain velocity condition, a q-axis voltage feedforward value VqFF and a q-axis voltage command value Vq* used for controlling driving of the plurality of motors, to detect an occurrence of miswire between the plurality of motors and the inverter when the following inequation is satisfied:

$$VqFF \geq 1.5 \cdot Vq^*.$$

2. The electric vehicle control device according to claim 1, wherein
   the certain velocity condition is that a velocity of the electric vehicle is equal to or below a certain allowable velocity during examination or inspection.

3. The electric vehicle control device according to claim 2, wherein
   the certain allowable velocity during examination or inspection is 30 km/hr.

4. The electric vehicle control device according to claim 1, wherein
   the controller comprises a miswire detector that outputs a miswire detection output signal when detecting the occurrence of miswire.

5. The electric vehicle control device according to claim 4, wherein
   the miswire detector comprises an output inhibitor that inhibits the output of the miswire detection output signal when a certain signal output condition is unsatisfied.

6. The electric vehicle control device according to claim 5, wherein
   the certain signal output condition is that a velocity of the electric vehicle is equal to or below a certain allowable velocity during examination or inspection and a notch position is in a certain range of notch positions during examination or inspection.

7. The electric vehicle control device according to claim 6, wherein
   the certain range of notch positions during examination or inspection is notch 3 or less.

8. The electric vehicle control device according to claim 1, further comprising
   a notifier that notifies of the occurrence of miswire.

* * * * *